United States Patent
Niu et al.

(10) Patent No.: US 12,340,101 B2
(45) Date of Patent: *Jun. 24, 2025

(54) SCALING OUT ARCHITECTURE FOR DRAM-BASED PROCESSING UNIT (DPU)

(71) Applicant: Samsung Electronics Co., Ltd., Suwon-si (KR)

(72) Inventors: Dimin Niu, Sunnyvale, CA (US); Shuangchen Li, Goleta, CA (US); Bob Brennan, San Jose, CA (US); Krishna T. Malladi, San Jose, CA (US); Hongzhong Zheng, Los Gatos, CA (US)

(73) Assignee: Samsung Electronics Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/593,885

(22) Filed: Mar. 2, 2024

(65) Prior Publication Data

US 2024/0211149 A1    Jun. 27, 2024

Related U.S. Application Data

(63) Continuation of application No. 16/942,641, filed on Jul. 29, 2020, now Pat. No. 11,934,669, which is a continuation of application No. 15/595,887, filed on May 15, 2017, now Pat. No. 10,732,866.

(60) Provisional application No. 62/485,370, filed on Apr. 13, 2017, provisional application No. 62/414,426, filed on Oct. 28, 2016, provisional application No. 62/413,977, filed on Oct. 27, 2016, provisional application No. 62/413,973, filed on Oct. 27, 2016.

(51) Int. Cl.
| | | |
|---|---|---|
| G06F 3/06 | (2006.01) | |
| G06F 15/78 | (2006.01) | |
| G11C 11/4096 | (2006.01) | |

(52) U.S. Cl.
CPC .......... *G06F 3/0631* (2013.01); *G06F 3/0604* (2013.01); *G06F 3/067* (2013.01); *G06F 15/7821* (2013.01); *G11C 11/4096* (2013.01)

(58) Field of Classification Search
CPC ...... G06F 3/0631; G06F 3/0604; G06F 3/067; G06F 3/061; G06F 3/068; G06F 15/7821; G11C 11/4096
USPC .............................. 711/112, 170, 105; 708/1
See application file for complete search history.

(56) References Cited

U.S. PATENT DOCUMENTS

| | | |
|---|---|---|
| 4,068,305 A | 1/1978 | Cutler |
| 5,594,698 A | 1/1997 | Freeman |
| 5,752,067 A | 5/1998 | Wilkinson et al. |
| 5,847,577 A | 12/1998 | Trimberger |
| 6,026,478 A | 2/2000 | Dowling |

(Continued)

FOREIGN PATENT DOCUMENTS

| | | |
|---|---|---|
| CN | 103907157 A | 7/2014 |
| CN | 105573959 A | 5/2016 |

(Continued)

*Primary Examiner* — Daniel C. Chappell
*Assistant Examiner* — Edward Waddy, Jr.
(74) *Attorney, Agent, or Firm* — Lewis Roca Rothgerber Christie LLP

(57) ABSTRACT

A processor includes a plurality of memory units, each of the memory units including a plurality of memory cells, wherein each of the memory units is configurable to operate as memory, as a computation unit, or as a hybrid memory-computation unit.

20 Claims, 6 Drawing Sheets

(56) References Cited

U.S. PATENT DOCUMENTS

| | | | |
|---|---|---|---|
| 6,094,715 A | 7/2000 | Wilkinson et al. | |
| 6,424,658 B1 | 7/2002 | Mathur | |
| 6,760,833 B1 * | 7/2004 | Dowling | G06F 9/3877 |
| | | | 712/E9.05 |
| 7,401,261 B1 | 7/2008 | Whittaker et al. | |
| 7,602,214 B2 | 10/2009 | Vorbach | |
| 8,516,187 B2 | 8/2013 | Chen et al. | |
| 8,566,669 B2 | 10/2013 | Schuette | |
| 9,455,022 B2 | 9/2016 | Yabuuchi et al. | |
| 9,503,095 B2 | 11/2016 | Gao et al. | |
| 9,577,644 B2 | 2/2017 | Gao et al. | |
| 10,423,363 B2 | 9/2019 | Prather | |
| 2003/0172364 A1 * | 9/2003 | Lin | H03K 19/177 |
| | | | 716/117 |
| 2005/0024923 A1 | 2/2005 | Kim et al. | |
| 2005/0027928 A1 * | 2/2005 | Avraham | G11C 14/0018 |
| | | | 711/103 |
| 2007/0011409 A1 | 1/2007 | Ingram et al. | |
| 2009/0164789 A1 * | 6/2009 | Carvounas | G06F 21/445 |
| | | | 713/176 |
| 2009/0328048 A1 | 12/2009 | Khan et al. | |
| 2010/0164972 A1 | 7/2010 | Akerib et al. | |
| 2011/0013442 A1 | 1/2011 | Akerib et al. | |
| 2011/0026323 A1 | 2/2011 | Luk et al. | |
| 2012/0017037 A1 * | 1/2012 | Riddle | G06F 16/24569 |
| | | | 711/E12.008 |
| 2012/0063202 A1 | 3/2012 | Houston et al. | |
| 2014/0247673 A1 | 9/2014 | Muralimanohar et al. | |
| 2015/0357020 A1 | 12/2015 | Manning | |
| 2016/0077577 A1 | 3/2016 | Van Lunteren et al. | |
| 2016/0232951 A1 | 8/2016 | Shanbhag et al. | |
| 2016/0275017 A1 | 9/2016 | Takeda | |
| 2017/0103236 A1 | 4/2017 | Homayoun, Jr. | |

FOREIGN PATENT DOCUMENTS

| | | |
|---|---|---|
| CN | 105703765 A | 6/2016 |
| EP | 0 570 729 A2 | 11/1993 |
| JP | 11-338767 A | 12/1999 |
| JP | 2016-123092 A | 7/2016 |
| KR | 10-2016-0042083 A | 4/2016 |
| KR | 10-2016-0083926 A | 7/2016 |
| WO | WO 01/01242 A1 | 1/2001 |
| WO | WO 2015/187771 A2 | 12/2015 |

* cited by examiner

SCALING OUT ARCHITECTURE FOR DRAM-BASED PROCESSING UNIT (DPU)

CROSS-REFERENCE TO RELATED APPLICATION(S)

This application is a continuation of U.S. patent application Ser. No. 16/942,641, filed on Jul. 29, 2020, which is a continuation of U.S. patent application Ser. No. 15/595,887, filed on May 15, 2017, now U.S. Pat. No. 10,732,866, dated Aug. 4, 2020, which claims priority to and the benefit of U.S. Provisional Patent Application No. 62/413,973, filed on Oct. 27, 2016, U.S. Provisional Patent Application No. 62/413,977, filed on Oct. 27, 2016, U.S. Provisional Patent Application No. 62/414,426, filed on Oct. 28, 2016, and U.S. Provisional Patent Application No. 62/485,370, filed on Apr. 13, 2017, the entire content of all of which is incorporated herein by reference.

FIELD

One or more aspects of embodiments according to the present invention relate to a DRAM-based processing unit (DPU), and more particularly, to a DPU cluster architecture.

BACKGROUND

A DRAM-based processing unit (DPU) may be used as an alternative accelerator to other processor and/or graphics accelerators, such as, for example, graphics processing units (GPUs) and application specific integrated circuits (ASICs). A new ecosystem corresponding to DPU may be provided with drivers and libraries designed to achieve improved or optimal mapping and scheduling for DPU.

A DPU may be reconfigurable and programmable. For example, the logic provided by DRAM cells may be configured (or reconfigured) to provide different operations, e.g., adder, multiplier, etc. For example, a DPU may be based on three transistor, one capacitor (3T1C)/one transistor, one capacitor (1T1C) DRAM process and structure with minor modifications. Because DPU typically does not contain specific computing logic (e.g., adders), memory cells may be used for computations.

SUMMARY

Aspects of embodiments of the present invention are directed toward methods and associated structures for a cluster architecture of a plurality of DRAM-based processing units (DPUs).

While each DPU may have, for example, 16 giga-byte (16 GB) capacity and may have 8 million (8M) computing units on a chip, each DPU may fall far short of a human brain that includes 10 billion neurons, for example. For example, hundreds to thousands of DPUs may be required to implement a human brain-like neural network (NN). According to one or more example embodiments, a multi-DPU scaling-out architecture may be used to provide a human brain-like NN.

In comparison to central processing unit (CPU)/graphics processing unit (GPU) scaling-out, DPU is more like memory (e.g., DIMM) scaling, and supports larger number of integration. Further, the communications overhead may be reduced or minimized.

According to example embodiments of the present invention, a processor includes a plurality of memory units, each of the memory units including a plurality of memory cells, wherein each of the memory units is configurable to operate as memory, as a computation unit, or as a hybrid memory-computation unit.

At least one of the memory units may be configured to receive a job from a host.

The memory units may be configured to be controlled by a host configured to perform at least one of job partitioning for, data distribution to, data collection from, or job distribution to, the memory units.

The processor may further include a storage unit configured to store memory unit-job mapping information.

Each of the memory units may include DRAM.

The memory units configured as computation units may be configurable to each perform a corresponding portion of a job if none of the computation units is available to perform or is capable of performing the job as a whole.

The plurality of memory units may be arranged in a scalable cluster architecture.

The processor may further include a plurality of memory controllers, each of the memory controllers being configured to control one or more of the memory units.

The processor may further include a plurality of routers for routing work flow between the memory units.

At least one of the routers may be embedded in a corresponding one of the memory controllers.

According to example embodiments of the present invention, a method of controlling work flow in a distributed computation system including a plurality of memory units is provided. The method includes: receiving work flow including a job to be performed by one or more of the memory units; performing by one of the memory units the job or a portion of the job according to the work flow; and forwarding by the one of the memory units a remainder of the work flow to another one of the memory units after completion of the job or the portion of the job.

The work flow may be generated by a host that receives a job request, and may be provided to at least one of the memory units.

The work flow may be generated by one or more of the memory units.

The method may further include reconfiguring one or more of the memory units as computation units or as memory depending on availability of resources.

An asynchronous communications protocol may be used to communicate between the memory units.

The remainder of the work flow may be forwarded to a subsequent one of the memory units until all jobs in the work flow are completed or ended in failure.

The job may be partitioned if one of the memory units cannot complete the job in its entirety.

According to example embodiments of the present invention, a method of controlling work flow in a distributed computation system including a plurality of memory units is provided. The method includes: receiving a first request from a host to perform a first job by one of the memory units; performing the first job by the one of the memory units; providing a result of the first job to the host from the one of the memory units; and receiving a second request from the host to perform a second job by another one of the memory units.

The another one of the memory units may further receive from the host the result of the first job.

The distributed computation system may further include the host configured to send the jobs and to read results of the jobs.

BRIEF DESCRIPTION OF THE DRAWINGS

These and other features and aspects of the present invention will be appreciated and understood with reference to the specification, claims, and appended drawings wherein:

DETAILED DESCRIPTION

Embodiments of the present invention are directed toward methods and associated structures for a plurality of DRAM-based processing units (DPUs), each configured as a node in a DPU cluster architecture. According to various embodiments of the present invention, each DPU may be referred to as a node or each DPU module (which includes a plurality of DPUs) may be referred to as a node. In example embodiments, each node includes a collection of multiple DPU modules. For example, a node may include a server that has a plurality of DPU modules, where each DPU module contains multiple DPUs (or DPU devices). The DPUs constitute a uniform merged memory and accelerator pool that can provide normal massively parallel processors or processing. The resources in each node may be limited by hardware (e.g., number of arithmetic logic units (ALUs), etc.).

A computer processing architecture (or system) according to example embodiments of the present invention may be referred to as a "processor" that includes a plurality of memory units (e.g., DPUs), where each of the memory units includes a plurality of memory cells, which may include 3T1C memory cells and/or 1T1C memory cells. According to example embodiments, a flexibility is provided to configure (and/or reconfigure) memory units that have substantially identical structure to operate as memory, as a computation unit, or as a hybrid memory-computation unit based on the resource requirement of the system and/or based on user design/preferences.

Figure 1:
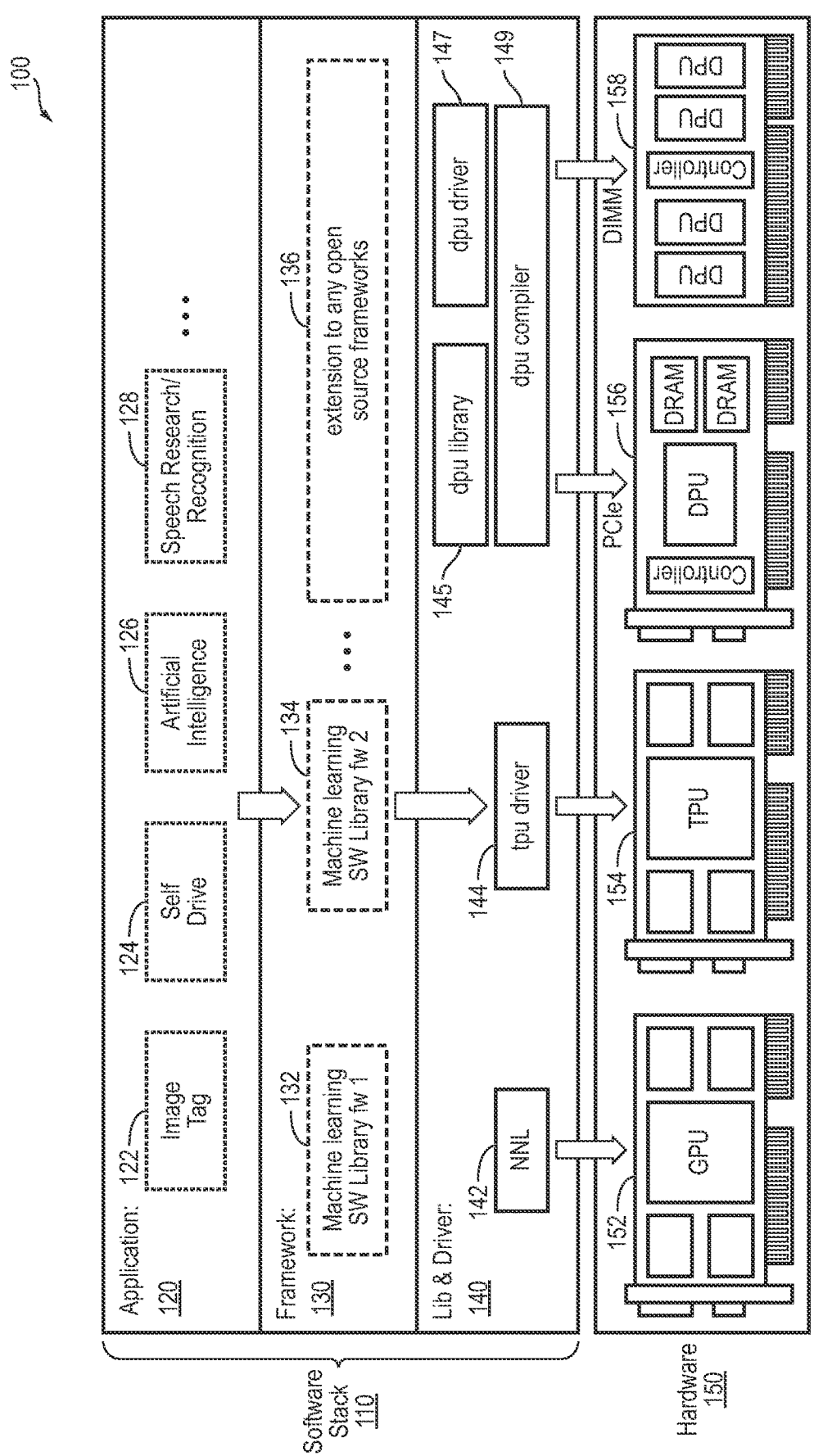
FIG. 1 is a schematic block diagram of a computer processing architecture according to example embodiments of the present invention.

FIG. 1 is a schematic block diagram of a computer processing architecture (or a system architecture) 100 according to example embodiments of the present invention.

The computer processing architecture 100 includes a hardware (or a hardware layer) 150, on which a software stack is generated to operate. The computer processing architecture 100 may be configured for accelerating deep learning, and may emulate or simulate a neural network.

The hardware 150, for example includes a GPU module 152, a tensor processing unit (TPU) module 154, a DRAM-based processing unit (DPU) module 156, and a multi-DPU module 158. Each of the GPU module 152 and the TPU module 154 may include a respective GPU or TPU and a plurality of support chips. The TPU, for example, may be implemented on an application specific integrated circuit (ASIC), and may be configured or optimized for machine learning. According to example embodiments, the DPUs may work similarly to other accelerators, such as a TPU or a GPU that are known to those skilled in the art.

The DPU modules illustrated in FIG. 1 has two form factors. The first one is the DPU module 156 on the Peripheral Component Interconnect Express (PCIe) bus, and the second one is the multi-DPU module 158 that is on the Dual In-line Memory Module (DIMM) bus. While the DPU module 156 is shown with one DPU device in FIG. 1, the DPU module 156 may be a PCIe device that may include one or more embedded DPUs. While the multi-DPU module 158 is shown with multiple DPU devices in FIG. 1, the multi-DPU module 158 may be a DIMM that may include one or more embedded DPUs. It should be understood that DPU modules in the hardware 150 of the computer processing architecture 100 is not limited to PCIe devices and/or DIMMs, but may include System on a Chip (SoC) devices or other memory-type devices that may contain DPUs. Computing cell arrays of a DPU may be configured to include a three transistor, one capacitor (3T1C) DRAM computing-cell topography and/or a one transistor, one capacitor (1T1C) DRAM computing-cell topography.

While the hardware 150 shown in FIG. 1 has one each of the GPU module 152, the TPU module 154, the DPU module 156, and the multi-DPU module 158, in other embodiments, the hardware may include any other suitable combinations of GPU modules, TPU modules, DPU modules, and/or multi-DPU modules. For example, in one embodiment, the hardware may include DPU modules and/or multi-DPU modules only.

The software stack 110 includes one or more libraries and drivers (e.g., a library and driver layer) 140, one or more frameworks (e.g., a framework layer) 130, and one or more applications (e.g., an application layer) 120. The one or more libraries may include a neural network library (NNL) 142, such as, for example, CUDA® Deep Neural Network library (cuDNN), which is a GPU-accelerated library of primitives for deep neural networks available from NVIDIA® and used for operating the GPU module 152. CUDA® and NVIDIA® are registered trademarks of NVidia Corporation, Santa Clara, CA. Of course, according to embodiments of the present invention, any other suitable commercially available and/or custom-made neural network libraries may be used instead of or in addition to cuDNN. The one or more drivers may include a TPU driver 144 for driving the TPU module 154.

The one or more libraries and drivers 140 according to one or more embodiments may include a DPU library 145 and a DPU driver 147 to support the DPU hardware (e.g., DPU modules 156 and 158). A DPU complier 149 may be used to compile the routines created using the DPU library 145 and the DPU driver 147 to operate the DPU module 156 and/or the multi-DPU module 158. To enable the accelerator including one or more DPU devices, according to example embodiments, the DPU driver 147 may be very similar to the TPU driver 144. The DPU library 145, for example, may be configured to provide optimal mapping functionality, resource allocation functionality and scheduling functionality for each sub-array in a DPU in the hardware 150 for different applications that may operate at the application layer 120.

In one embodiment, the DPU library 145 may provide a high-level application programming interface (API) for the framework layer 130 that may include operations such as move, add, multiply, etc. For example, the DPU library 145 may also include implementations for standard-type routines, such as, but not limited to, forward and backward convolution, pooling, normalization, and activation layers that may be applicable for an accelerated deep learning process. In one embodiment, the DPU library 145 may include an API-like function that maps a calculation for a whole convolution layer of a convolution neural network (CNN). Additionally, the DPU library 145 may include API-like functions for optimizing a mapping of a convolution layer calculation onto DPU.

The DPU library 145 may also include API-like functions for improving or optimizing resource allocation by mapping any individual or multiple parallelisms within a task (batch, output channel, pixels, input channels, convolution kernels) into corresponding DPU parallelisms at the chip, bank, sub-array and/or mat level. Additionally, the DPU library 145 may include API-like functions that provide optimal DPU configuration at initialization and/or runtime that trades off performance (i.e., data movement flow) and power consumption. Other API-like functions provided by the DPU library 145 may include design-knob-type functions, such as, setting the number of active subarrays per bank, the number of input feature maps per active subarrays, a partitioning of a feature map, and/or a reuse scheme of the convolution kernel. Still other API-like functions may provide additional resource allocation optimization by allocating for each subarray a specific task, such as convolution computing, channel sum up, and/or data dispatching. If operands are to be converted between an integer and a stochastic number, the DPU library 145 may include API-like functions that reduce or minimize the overhead while meeting precision constraints. In the event that the precision is lower than expected, the DPU library 145 may include API-like functions that either compute the value again using additional bits for a stochastic representation, or offload the task to other hardware, such as a CPU.

The DPU library 145 may also include API-like functions that concurrently (or simultaneously) schedule activated sub-arrays in a DPU, and schedule data movement so that it is hidden by computing operations.

Another aspect of the DPU library 145 may include an extension interface for further DPU development. In one embodiment, the DPU library 145 may provide an interface to directly program functionality using NOR and shift logic so that operations other than standard-type operations (i.e., add, multiply, MAX/MIN, etc.) may be provided. The extension interface may also provide an interface so that an operation that is not specifically supported by the DPU library 145 may be offloaded at the library and driver layer 140 to a SoC controller, a central processing unit/graphics processing unit (CPU/GPU) component and/or a CPU/Tensor Processing Unit (CPU/TPU) component. Yet another aspect of the DPU library 145 may provide an API-like function to use the memory of a DPU as an extension of memory when the DPU memory is not being used for computing.

The DPU driver 147 may be configured to provide an interface connection between a DPU at the hardware layer 150, the DPU library 145, and an operating system (OS) at a higher layer to integrate the DPU hardware layer into a system. That is, the DPU driver 147 exposes a DPU to a system OS and the DPU library 145. In one embodiment, the DPU driver 147 may provide DPU control at initialization.

In one embodiment, the DPU driver 147 may send instructions in the form of DRAM-type addresses or sequences of DRAM-type addresses to a DPU and may control data movement into and out of a DPU. The DPU driver 147 may provide multi-DPU communication along with handling DPU-CPU and/or DPU-GPU communications.

The DPU compiler 149 may compile the DPU code from the DPU library 145 into DPU instructions in the form of memory addresses that are used by the DPU driver 147 to control a DPU. The DPU instructions generated by the DPU compiler 149 may be single instructions that operate on one and/or two rows in a DPU, vector instructions, and/or gathered vector, read-on-operation instructions.

The DPU module 156, for example, may use the PCI Express (PCIe) interface for communications, and the multi-DPU module 158 may use the dual-inline memory module (DIMM) interface for communications. The DPU module 156 includes a controller and one or more DRAM chips/modules in addition to the DPU. The multi-DPU module 158 may include a controller configured to control two or more DPUs.

For example, the DPUs in the multi-DPU module 158 may be configured to have a distributed DPU cluster architecture in which the DPUs are arranged such that processing or jobs can be distributed/shared between one or more of the DPUs. For example, the multi-DPU module may have a cluster architecture that can provide a human brain-like neural network (NN) capacity. In order to provide the neural network capacity, the cluster architecture may be configured with a plurality of DPUs, a plurality of DPU modules, each including multiple DPUs, and/or a plurality of DPU nodes, each including multiple DPU modules. Each of the DPUs in the cluster architecture can be configured as all-memory, all-computation, or a combination (e.g., a hybrid memory-computation architecture).

The framework 130 may include a first machine learning software library framework 132, a second machine learning software library framework 134, and/or may extend to one or more other open source frameworks 136 known to those skilled in the art to enable the DPUs. In example embodiments, existing machine learning libraries may be used for the frameworks. For example, the frameworks may include Torch 7 and/or Tensor Flow, or any other suitable framework or frameworks known to those skilled in the art.

In example embodiments, the framework layer 130 may be configured to provide a user-friendly interface to the library and driver layer 140 and the hardware layer 150. In one embodiment, the framework layer 130 may provide a user-friendly interface that is compatible to a wide range of applications at the application layer 120 and makes the DPU hardware layer 150 transparent to a user. In another embodiment, the framework layer 130 may include framework extensions that add quantitation functions to existing, conventional methods, such as, but not limited to, Torch7-type applications and TensorFlow-type applications. In one embodiment, the framework layer 130 may include adding quantitation functions to a training algorithm. In another embodiment, the framework layer 130 may provide an override to existing batch-normalization methods of divide, multiply and square root to be shift approximated methods of divide, multiply and square root. In still another embodiment, the framework layer 130 may provide an extension that allows a user to set the number of bits used for a calculation. In yet another embodiment, the framework layer 130 may provide the capability to wrap multi-DPU API from the DPU library and driver layer 140 to the framework layer 130, so that a user may use multiple DPUs at the hardware layer similar to a use of multiple GPUs. Still another feature of the framework 130 may allow a user to assign functions to either a DPU or a GPU at the hardware layer 150.

On top of the frameworks may be implemented one or more applications 120, which may include an image tag 122, a self-drive algorithm 124, an artificial intelligence 126, and/or speech research/recognition 128, and/or any other suitable and desirable applications known to those skilled in the art.

In some embodiments, a host may partition jobs and distribute/collect data/jobs for each partitioning in the DPU cluster architecture. In some embodiments, one or more routers may be embedded inside a DIMM controller, and may operate according to asynchronous communication protocol. In other embodiments, routers may be installed outside (or separate from) the DIMM or other memory controllers.

While embodiments according to the present invention are described primarily in reference to DRAMs (e.g., 3T1C or 1T1C DRAMs), the present invention is not limited thereto. For example, in some embodiments, any other suitable memory may be used instead of DRAMs to generate memory-based processing units (e.g., memory units).

In a typical architecture including a pool of accelerators and a pool of memory, a host typically provides an interface between the accelerators and the memory. Because of such architecture in which the host is interposed between the accelerators and the memory, the host may create a bottleneck between the accelerators and the memory.

To reduce or prevent such bottleneck, in example embodiments according to the present invention, the host is not located between the accelerators and the memory. Instead, the accelerators may be implemented using a plurality of DPUs. For example, each DPU module may include a plurality of DPUs and a DPU controller, which may be implemented as a system-on-chip (SoC). Further, a plurality of DPU modules are coupled together to a DPU router. The DPU router may be implemented in the same SoC as the DPU controller. However, the present invention is not limited thereto, and a controller & router may be implemented externally to the SoC that includes the DPU controller. Further, each of the DPU modules may include a DPU router or a single DPU router may be shared by two or more DPU modules.

Figure 2:
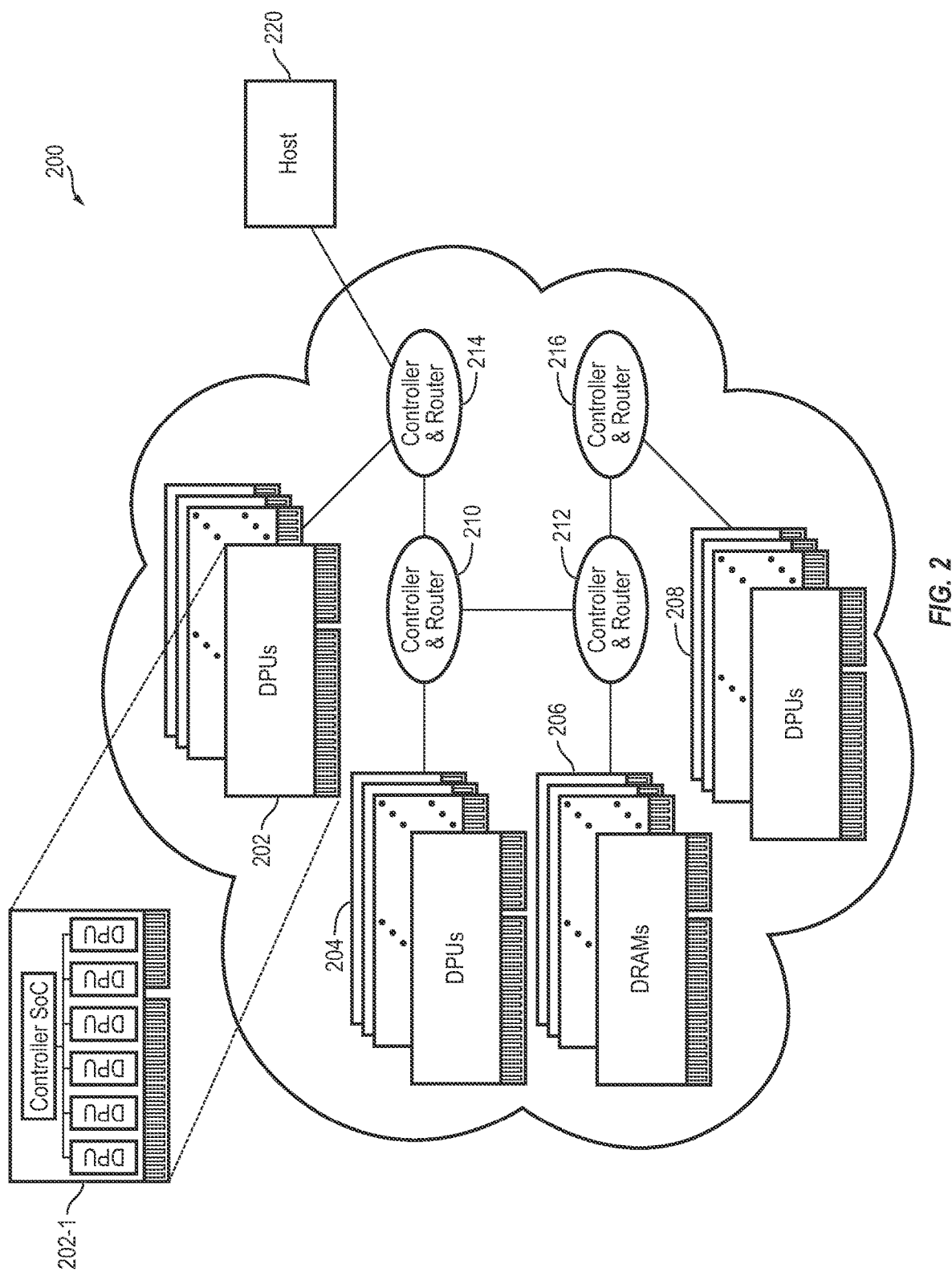
FIG. 2 is a schematic block diagram of a distributed DPU cluster architecture according to example embodiments of the present invention.

FIG. 2 is a schematic block diagram of a distributed DPU cluster architecture 200 according to example embodiments of the present invention.

In the distributed DPU cluster architecture 200 of FIG. 2, a plurality of DPU modules 202, 204, 208 and a DRAM module 206 are coupled to each other via controllers & routers 210, 212, 214, 216. While only the DRAM module 206 is shown to be configured as memory, the present invention is not limited thereto, and any of the DPU/DRAM modules may be configured as memory, as a computational unit (or a processing unit/processor), or as a hybrid memory-computational unit. While DPUs and DRAMs may be referred to as accelerators and memory modules (or memory), respectively, they have substantially the same hardware structures as each other, and the DPUs and the DRAMs may be viewed as DPUs (or memory units) that are configured differently for computations and storage, respectively. Further, according to example embodiments, each of the DPUs can be reconfigured to function as an accelerator (for computations) or as memory (for storage), or to have both the functions of an accelerator and memory.

A host 220 is also coupled to the DPUs via one of the controller & router 214. The architecture 200 may be referred to as a host centric architecture, in which all of the work (e.g., jobs) is generated by the host 220. Here, the host 220 would know what the resources are on the network, and will send the specific command or commands and the work load to a specific DPU through one or more controllers & routers 210, 212, 214, 216. In example embodiments, the performance may be bound by the host 220 because it is the host's responsibility to perform all tasks related to scheduling and mapping, while the DPUs only perform computations and storage.

For example, when multiple DPUs are located inside one server/computer/node, those DPUs can communicate directly with each other. For DPUs that are not in the same server/computer/node, they may communicate with each other through one or more routers and/or switches (e.g., the controllers & routers 210, 212, 214, 216), which may take place via one or more communication paths, such as the Internet.

Each of the DPU modules, for example, the DPU module 202-1, includes a plurality of DPUs that are coupled to the same DPU controller (e.g., the controller SoC). The DPUs on the same DPU module are coupled to the DPU controller via an intra-DIMM connection, which may be a bus based connection (e.g., a hierarchical bus based connection). Hence, these DPUs on the same DPU module may be controlled with on-DIMM SoC controller, which is mounted on the same DPU module as the DPUs that it controls. Here, the controller SoC in the DPU may be responsible to receive commands/data and manage the DPUs in the DPU module.

The DPU modules may be coupled to each other via an inter-DIMM connection, in which the DPU modules are coupled to a memory controller, which is coupled to a router. The router may couple the DPUs/DRAMs into the memory/accelerator network.

In the distributed DPU cluster architecture of FIG. 2, for example, a bottleneck at an interface between memory and accelerators may be avoided by providing a uniform merged memory and accelerator pool. For example, as the host 220 is coupled to the controller & router 214 at an edge of the network, there is little or no bottleneck caused by the host 220 between the memory and the accelerators. For instance, the pool of memory and accelerators has a flexible network connection. Further, each node could be configured as either an accelerator (DPU) or memory (DRAM). In some embodiments, each node may operate as an accelerator-memory hybrid that includes features of both an accelerator and memory. For example, each node may be a collection of multiple DPU modules, and may include a server that has a plurality of DPU modules, where each DPU module may contain multiple DPU devices.

Hence, in a distributed DPU cluster architecture according to one or more example embodiments of the present invention, a uniform merged memory and accelerator pool is provided to generate normal massively parallel processors. Here, resource in each node may be limited by hardware (e.g., number of arithmetic logic units (ALUs), etc.). In other words, the limited number of ALUs may determine the maximum memory capacity or the maximum computation capability that a DPU can provide.

The DPU cluster architecture provides reconfigurable memory/computation resources, and all resources in each DPU node can be configured as all-memory, all-computation unit, or a combination (or hybrid) of memory and computational unit. This way, depending on the storage and/or computational requirements at each node, the waste of storage and/or computational resources may be prevent or reduced. This is because each of the nodes can be configured or reconfigured during use as necessary or desired by the user to provide more storage resources or more computational resources.

Figure 3:
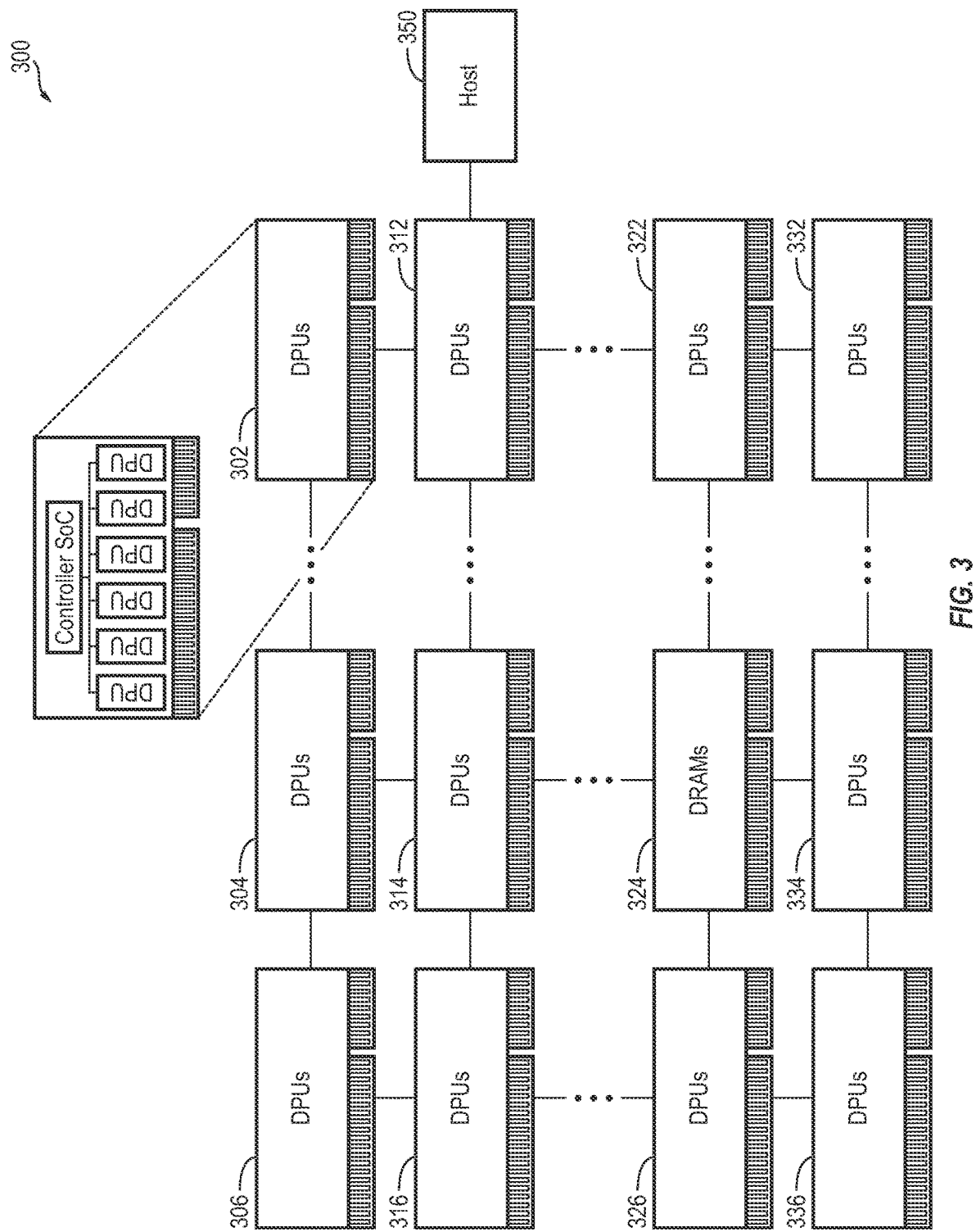
FIG. 3 is a schematic block diagram of a distributed DPU cluster architecture with embedded routers according to example embodiments of the present invention.

FIG. 3 is a schematic block diagram of a distributed DPU cluster architecture 300 with embedded routers according to example embodiments of the present invention. The architecture 300 of FIG. 3 is different from the architecture 200 of FIG. 2 in that the routers are combined into the DPU controller. The distributed DPU cluster architecture 300 may also be referred to as a host centric architecture.

Similar to the DPU cluster architecture of FIG. 2, in FIG. 3, a bottleneck at an interface between the accelerator pool and the memory pool can be reduced or avoided because there is no host that is located at the interface between the accelerator pool and the memory pool. According to the distributed DPU cluster architecture 300 of FIG. 3, a plurality of DPU modules/DRAM modules 302, 304, 306, 312, 314, 316, 322, 324, 326, 332, 334, 336 are arranged in rows and columns. As one of the DPU modules 312 is coupled to the host 350 at an edge of the network, there is little or no bottleneck caused by the host 350.

In the host centric architecture according to example embodiments of the present invention, in the beginning the host will generate work or work portions for different DPUs. For example, a work 1 (or a work portion 1) may be assigned to DPU1, and a work 2 (or a work portion 2) may be assigned to DPU2. Then, the host may send the work 1 in a work flow to DPU1. The work flow may also include the work 2 to be sent to DPU2. When the DPU1 finishes its work, the DPU1 can directly send the result to DPU2 without sending the result back to the host because the DPU1 knows where the next step is (as mapped/scheduled by the host). For example, when the DPU1 finishes its work, it can directly send intermediate data (or an intermediate result) to DPU2 for other computations. Therefore, it is not necessary for the DPU1 to send the intermediate data back to the host for the host to send the received intermediate data to the DPU2. Hence, in the DPU cluster architecture 300 of FIG. 3, the DPU nodes can communicate with each other without the host. For example, the host may only send a command or commands to ask DPU1 to forward data to DPU2, and it is SoC controller's responsibility to move the data. This is possible in the host centric architecture of FIGS. 2 and 3 according to example embodiments because the host knows all the resources in the network, and it is the host's responsibility to perform the mapping and the scheduling. Hence, the host may not have to be involved at each step of the computations. According to some other example embodiments of the present invention, a system architecture is provided in which no device on the network necessarily knows how the network looks like or what resources are available on the network.

As can be seen in FIG. 3, only one of the modules (i.e., the DRAM module 324) is configured as memory, whereas the remainder of the modules are configured as processing/computational modules. In other embodiments, one or more of the modules may be configured as memory modules or hybrid computational/memory modules. Each of the DPU/DRAM modules includes a plurality of DPUs and a DPU controller (i.e., Controller SoC), such that each of the modules can be configured or reconfigured as a DPU module or as a DRAM module. Also, within the same DPU/DRAM module, one or more of the DPUs may be configured as memory while one or more other ones of the DPUs may be configured as computational units (or processing units) even though all DPUs/DRAMs have substantially the same hardware structure as each other.

For example, in some embodiments, routers are implemented with a DIMM controller SoC. Further, an asynchronous communications protocol may be used to ensure proper inter-DIMM communications, where a handshake may be used. In other embodiments, synchronous protocol, such as double data rate (DDR), may be used. Because the host 350 is located at one edge of the network and not between the DPU/DRAM modules, less host bandwidth usage may result and any bottleneck caused by the host may be reduced or eliminated.

In some example embodiments, while the DPUs/DRAMs or DPU modules/DRAM modules are arranged in a distributed DPU cluster architecture, they may still be centrally controlled by a host. In such embodiments, the host maintains DPU/DRAM-job mapping information. The job mapping information may be in the form of software and/or drivers. In the network, neural network parameters and other useful data may be stored in DRAM, which may be in one of the nodes in the cluster.

According to example embodiments of the present invention, two separate host centric architectures/configurations are provided. In a first host centric architecture, the host will forward all the work load in a work flow to a first DPU, and the first DPU will forward the rest of the work load and/or the result to a second DPU. The second DPU will perform computations and will forward the result and the rest of the work load in the work flow to a third DPU, and so on and so forth. In a second host centric architecture, at each step, the host reads the data back, and generate the next work and sends the next work together with intermediate data (e.g., result of computations performed in previous DPU(s)) to the next DPU or DPUs. In other example embodiments, an ad hoc control may be provided in which one or more DPUs are capable of generating work flows including jobs without mapping/scheduling by a host, and a host may not even be required. Each of the above example embodiments may be implemented using a suitable system/hardware architecture illustrated in any of FIGS. 1, 2 and 3.

Figure 4:
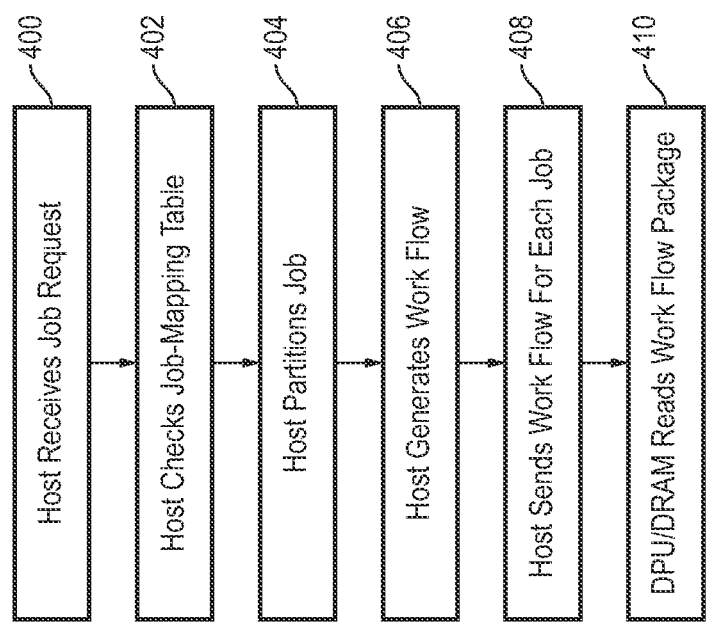
FIG. 4 is a flow diagram of a distributed DPU cluster control by a host according to example embodiments of the present invention, in which a centralized control by the host is implemented.

FIG. 4 is a flow diagram of a distributed DPU cluster control by a host according to example embodiments of the present invention, in which a centralized control by the host is implemented.

In box 400 of FIG. 4, the host receives a job request. In box 402, the host checks the DPU/DRAM-job mapping table stored in memory. In the job mapping table checking process, the host looks for DRAMs that stores parameters of the job. For example, for neural network applications, the host may look for DRAMs that have NN parameters. The host also looks for available DPU resources.

In box 404, if a DPU cannot finish the job individually, the host partitions job to two or more DPU resources. For example, the job may be partitioned into job1, job2, etc., and they may be assigned to two or more different DPUs, for example, job1 to DPU1, job2 to DPU2, and/or the like.

In box 406, the host generates work flow, for example, the host assigns a resource number and a job number (e.g., (resource#, Job#)) for each job and/or each partitioned portion of a job. For example, the work flow (WF) may have a following format: WF=[(resource1, job1), (resource2, job2), (resource3, job3) . . . (resourceN, jobN), (host, Done)], and/or the like. Here, the resources may be in reference to DPUs/DRAMs (or DPU/DRAM modules). In example embodiments according to the present invention, the work flow may have any other suitable format known to those skilled in the art.

In box 408, the host sends work flow to the DPU/DRAM connected to the host. In box 410, the DPU/DRAM (or DPU/DRAM module) reads the work flow package. If "resource" on the top of work flow matches current resource, it performs "job" on the top of work flow, and then removes (resource#, job#) pairs from the work flow. Then the remainder of the work flow is forwarded to one or more other resources (e.g., DPUs). If there is no match, the DPU/DRAM forward the work follow towards resource 1, which may be the resource in the next (resource#, job#) pair. However, the present invention is not limited to any particular scheme, and any suitable scheme known to those skilled in the art may be used. Once the work flow is completed, the host determines that all jobs are done, which means that all (resource#, Job#) pairs are finished from 0 to N.

Figure 5:
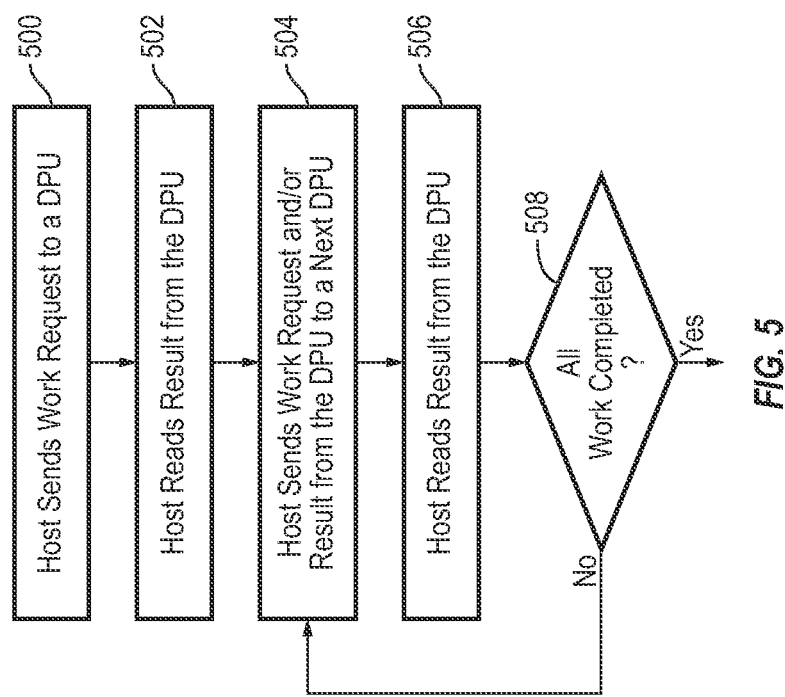
FIG. 5 is a flow diagram of a distributed DPU cluster control according to example embodiments of the present invention, in which a host takes an active role in each computation step.

FIG. 5 is a flow diagram of a distributed DPU cluster control according to example embodiments of the present invention, in which a host takes an active role in each computation step.

In box 500 of FIG. 5, a host sends a work request to a DPU, then in box 502, the host reads result of computations from the DPU, or the DPU may send the result back to the host. The host then in box 504 sends a work request and/or the result from the DPU to a next DPU, and in box 506 reads result of computations from the next DPU, and so on and so forth, until all work is completed in box 508. In this host centric architecture, the host is involved in each computation step, and more actively controls the work flow and the flow of data between DPUs.

Figure 6:
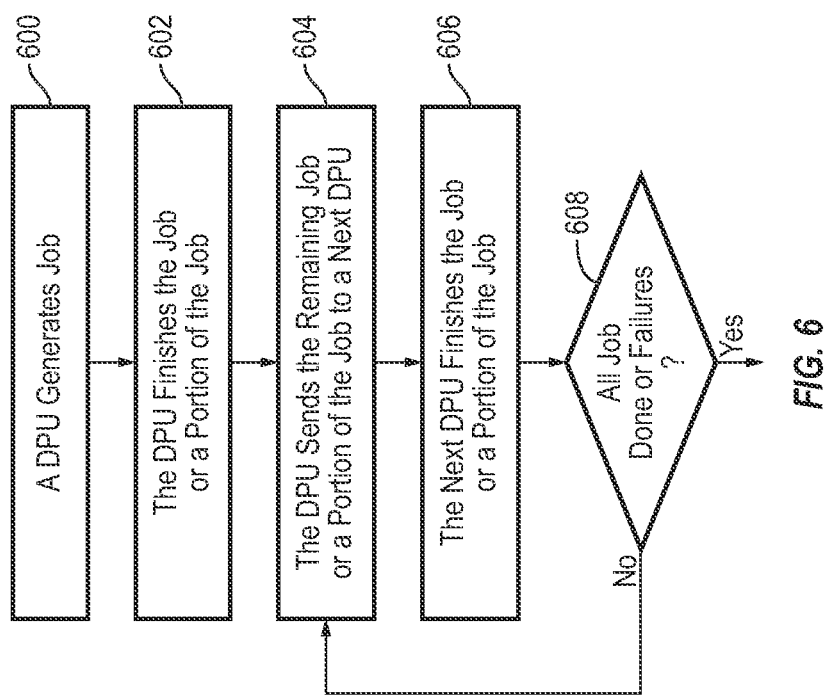
FIG. 6 is a flow diagram of a distributed DPU cluster control according to example embodiments of the present invention, in which an ad hoc control is implemented.

Unlike the centralized control of the host centric architecture depicted in the flow diagrams of FIGS. 4 and 5, according to one or more example embodiments of the present invention, the distributed DPU cluster architecture is controlled in an ad hoc manner without centralized control or with less or minimum centralized control. FIG. 6 is a flow diagram of a distributed DPU cluster control according to example embodiments of the present invention, in which an ad hoc control is implemented. For example, in the ad hoc control mechanism according to some example embodiments, each DPU can generate job (or a work flow of jobs) as shown in box 600 of FIG. 6. Further, there may be no need for a resource table, and may be no requirement that a DPU/DRAM-job mapping information be stored in memory. According to this ad hoc scheme, the DPU (e.g., DPU 0) that generates the job (or a work flow of jobs) finishes the job or a portion of the job as shown in box 602, then sends the remaining job(s) and/or portion(s) of the job (e.g., a remainder of the work flow) to one or more adjacent DPU nodes (e.g., a next DPU or DPU 1, 2, 3, etc.) with routing information as shown in box 604. Then, in box 606, the next DPU (or DPUs) finishes the job(s) and/or portion(s) of the job. The process of finishing the job (or a portion thereof), and sending the remaining job(s) (or portion(s) thereof) is repeated as shown in box 608 until all jobs are done or job or job assignment fails (e.g., no more resource is available).

Some of the features of the ad hoc control are that no host server is required, there is no need to maintain large cluster information, and a huge cluster (e.g., possibly up to 100 to 1,000 times the DPUs available in existing networks to generate a neural network similar in size to that of a human brain) can be supported. Unless the control is centralized, however, the resource management may be less than optimal, and failures may happen at the end. The significance of failures may depend largely on the applications. For some applications, the failures may be critical, while it may not be as critical in other applications. For example, in an artificial intelligence (AI) application, which mimics the human brain behavior, it may remember something or not. Also, it may remember something at one time but cannot remember it at another time. If the DPU system architecture according to embodiments of the present invention are used for a large scale neural network application, some failures may be acceptable.

In yet other embodiments, the distributed DPU cluster architecture may operate with a hybrid centralized and ad hoc controls. For example, some of the DPUs and/or DPU modules may be controlled by a host while other ones of the DPUs and/or DPU modules may be controlled in an ad hoc manner. For another example, at least some of the DPUs and/or DPU modules may be reconfigurable such that their control may switch back and forth between centralized control and ad hoc control as desired or necessary.

Therefore, embodiments of the present invention are directed to a cluster architecture in which a plurality of DRAM-based processing units (DPUs) are arranged and having a distributed architecture that can provide a human brain-like neural network capacity. The DPU cluster provides reconfigurable memory/computation resources, such that all resources in a DPU node can be configured as all-memory, all-computation, or combined (i.e., a hybrid memory-computation unit).

In some embodiments having a host centric architecture, a host may partition jobs and/or distribute/collect data/jobs for each partitioning. Here, the host may generate and send work flows for the DPUs to finish jobs and forward remaining jobs and/or resulting data to other DPUs, or the host may control each computation step by receiving and forward resulting data together with jobs to other DPUs. In other embodiments, the control of the cluster architecture may be provided ad hoc, in which one or more of the DPUs may generate jobs/work flows, completes a job, and/or send remainder of the jobs/work flows to other DPUs in the network. In still other embodiments, a hybrid of centralized control and ad hoc control may be implemented to control the DPU/DRAM cluster architecture. The router may operate according to asynchronous communication protocol, and may be embedded inside DIMM controller.

It will be understood that, although the terms "first," "second," "third," etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the spirit and scope of the present invention.

A relevant device or component (or relevant devices or components), e.g., according to embodiments of the present invention described herein may be implemented utilizing any suitable hardware (for example, an application-specific integrated circuit), firmware (for example, a DSP or FPGA), software, or a suitable combination of software, firmware, and hardware. For example, the various components of the relevant device(s) may be formed on one integrated circuit (IC) chip or on separate IC chips. Further, the various components of the relevant device(s) may be implemented on a flexible printed circuit film, a tape carrier package (TCP), a printed circuit board (PCB), or formed on a same substrate as one or more circuits and/or other devices. Further, the various components of the relevant device(s) may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present invention.

Further, it will also be understood that when one element, component, region, layer, and/or section is referred to as being "between" two elements, components, regions, layers, and/or sections, it can be the only element, component, region, layer, and/or section between the two elements, components, regions, layers, and/or sections, or one or more intervening elements, components, regions, layers, and/or sections may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," "one of," and "selected from," when preceding a list of elements, modify the entire list of elements and do not modify the individual elements of the list. Further, the use of "may" when describing embodiments of the present invention refers to "one or more embodiments of the present invention."

As used herein, the terms "use," "using," and "used" may be considered synonymous with the terms "utilize," "utilizing," and "utilized," respectively.

Features described in relation to one or more embodiments of the present invention are available for use in conjunction with features of other embodiments of the present invention. For example, features described in a first embodiment may be combined with features described in a second embodiment to form a third embodiment, even though the third embodiment may not be specifically described herein.

A person of skill in the art should also recognize that the process may be executed via hardware, firmware (for example via an ASIC), or in any combination of software, firmware, and/or hardware. Furthermore, the sequence of steps of the process is not fixed, but can be altered into any desired sequence as recognized by a person of skill in the art. The altered sequence may include all of the steps or a portion of the steps.

Although the present invention has been described with regard to certain specific embodiments, those skilled in the art will have no difficulty devising variations of the described embodiments, which in no way depart from the scope and spirit of the present invention. Furthermore, to those skilled in the various arts, the invention itself described herein will suggest solutions to other tasks and adaptations for other applications. It is the Applicant's intention to cover by claims all such uses of the invention and those changes and modifications which could be made to the embodiments of the invention herein chosen for the purpose of disclosure without departing from the spirit and scope of the invention. Thus, the present embodiments of the invention should be considered in all respects as illustrative and not restrictive, the scope of the invention to be indicated by the appended claims and their equivalents.

What is claimed is:

1. A memory device comprising:
   programmable memory configured to operate as a computation unit, and reconfigurable to perform storage operations based on a configuration for additional memory,
   wherein the programmable memory comprises an interface to change the configuration for the additional memory.

2. The memory device of claim 1, wherein the programmable memory is further reconfigurable to operate as the computation unit based on a configuration for the computation unit.

3. The memory device of claim 1, wherein the programmable memory is further reconfigurable to both operate as the computation unit and perform the storage operations as a hybrid memory-computation unit.

4. The memory device of claim 1, wherein the programmable memory is configured to be controlled by a host configured to perform at least one job of partitioning for, data distribution to, data collection from, or job distribution to, the programmable memory.

5. The memory device of claim 1, wherein the programmable memory comprises DRAM.

6. The memory device of claim 1, wherein the programmable memory comprises a plurality of programmable memory units arranged in a scalable cluster architecture.

7. The memory device of claim 6, wherein a first memory unit from among the programmable memory units is configured to perform a first portion of a job and a second memory unit from among the programmable memory units is configured to perform a second portion of the job, in response to the first and second memory units being unavailable to perform an entirety of the job or being incapable of performing the entirety of the job.

8. The memory device of claim 6, wherein at least one of the programmable memory units is configured as the computation unit, and at least another one of the programmable memory units is configured to perform the storage operations.

9. A distributed computation system comprising:
   a first memory unit; and
   a second memory unit,
   wherein at least one of the first or second memory units comprises:
      programmable memory configured to operate as a computation unit, and reconfigurable to perform storage operations based on a configuration for additional memory; and
      an interface to change the configuration for the additional memory.

10. The system of claim 9, wherein at least one of the first or second memory units is further reconfigurable to operate as the computation unit based on a configuration for the computation unit.

11. The system of claim 9, wherein at least one of the first or second memory units is further reconfigurable to both operate as the computation unit and perform the storage operations as a hybrid memory-computation unit.

12. The system of claim 9, wherein the first memory unit is configured to perform at least a portion of a job according to a workflow, and to forward a remainder of the workflow to the second memory unit after completion of the at least the portion of the job.

13. The system of claim 9, wherein the first and second memory units are configured to communicate with each other using an asynchronous communication protocol.

14. The system of claim 9, wherein the first memory unit is configured to perform a first job corresponding to a first request received by a host, and to provide a result of the first job to the host.

15. The system of claim 14, wherein the second memory unit is configured to receive the result of the first job from the host.

16. The system of claim 14, wherein the second memory unit is configured to receive a second request from the host, and to be reconfigured according to at least one of the configuration for additional memory or the configuration for the computation unit corresponding to the second request.

17. A method of controlling work flow in a distributed computation system, the method comprising:
   receiving a work flow comprising a job to be performed by a first memory unit;
   performing, by the first memory unit, at least a portion of the job according to the work flow; and
   receiving, by a second memory unit, a remainder of the work flow,
   wherein at least one of the first or second memory units comprises:
      programmable memory configured to operate as a computation unit, and reconfigurable to perform storage operations based on a configuration for additional memory; and
      an interface to change the configuration for the additional memory.

18. The method of claim 17, further comprising:
   forwarding, by the first memory unit, the remainder of the workflow to the second memory unit.

19. The method of claim 17, further comprising:
   providing, by the first memory unit, a result of the at least the portion of the job to a host; and
   receiving, by the second memory unit, the result and the remainder of the workflow from the host.

20. The method of claim 19, further comprising:
   reconfiguring the second memory unit according to at least one of the configuration for additional memory or a configuration for the computation unit corresponding to the remainder of the workflow.

* * * * *